US010868221B2

(12) United States Patent
Ahn et al.

(10) Patent No.: US 10,868,221 B2
(45) Date of Patent: Dec. 15, 2020

(54) METHOD FOR MANUFACTURING CHIP-MOUNTING SUBSTRATE, AND CHIP-MOUNTING SUBSTRATE

(71) Applicant: POINT ENGINEERING CO., LTD., Asan (KR)

(72) Inventors: Bum Mo Ahn, Suwon (KR); Seung Ho Park, Hwaseong (KR); Tae Hwan Song, Cheonan (KR)

(73) Assignee: POINT ENGINEERING CO., LTD., Asan (KR)

( * ) Notice: Subject to any disclaimer, the term of this patent is extended or adjusted under 35 U.S.C. 154(b) by 0 days.

(21) Appl. No.: 16/791,846

(22) Filed: Feb. 14, 2020

(65) Prior Publication Data
US 2020/0185570 A1 Jun. 11, 2020

Related U.S. Application Data

(63) Continuation of application No. 15/468,717, filed on Mar. 24, 2017, now abandoned.

(30) Foreign Application Priority Data

May 17, 2016 (KR) ........................ 10-2016-0060377

(51) Int. Cl.
*H01L 21/48* (2006.01)
*H01L 33/48* (2010.01)
(Continued)

(52) U.S. Cl.
CPC .......... *H01L 33/486* (2013.01); *H01L 21/481* (2013.01); *H01L 23/00* (2013.01);
(Continued)

(58) Field of Classification Search
CPC ......... H01L 33/62; H01L 33/46; H01L 33/60; H01L 33/486; H01L 21/481;
(Continued)

(56) References Cited

U.S. PATENT DOCUMENTS

2007/0278511 A1 12/2007 Ohno et al.
2012/0224335 A1 9/2012 Yuan et al.
(Continued)

FOREIGN PATENT DOCUMENTS

| CN | 103560127 A | 2/2014 |
|---|---|---|
| CN | 105164822 A | 12/2015 |
| JP | 5688330 A | 7/1981 |
| KR | 100678860 B1 | 1/2007 |
| KR | 101160120 B1 | 6/2012 |

(Continued)

OTHER PUBLICATIONS

Office Action dated May 13, 2019 for Chinese Application 201710192959.3.
Office Action dated May 17, 2016 for Korean Application KR10-2016-0060377.
Extended Office Action dated May 4, 2017 for Eurpean Application EP 17 169 523.2.
Office Action dated Sep. 4, 2018 for Chinese Application 201710192959.3.

*Primary Examiner* — Mark W Tornow

(57) ABSTRACT

A method for manufacturing a chip-mounting substrate includes a pre-coating step of forming a precoat on a substrate including a plurality of conductive portions and an insulating portion interposed between the conductive portions, an etching step of etching at least a portion of the precoat through a laser to form a pattern, and a step of forming a metal layer on the substrate. The pattern is disposed on at least one of the conductive portions, and the metal layer is formed in the pattern.

1 Claim, 15 Drawing Sheets

(51) Int. Cl.
*H01L 23/00* (2006.01)
*H01L 33/62* (2010.01)
*H01L 33/60* (2010.01)
*H01L 33/46* (2010.01)
*H01L 23/498* (2006.01)

(52) U.S. Cl.
CPC .......... *H01L 33/62* (2013.01); *H01L 21/4846* (2013.01); *H01L 23/498* (2013.01); *H01L 33/46* (2013.01); *H01L 33/60* (2013.01); *H01L 2224/81385* (2013.01); *H01L 2224/83385* (2013.01); *H01L 2224/83439* (2013.01); *H01L 2224/85439* (2013.01); *H01L 2933/0033* (2013.01); *H01L 2933/0066* (2013.01)

(58) Field of Classification Search
CPC ....... H01L 21/4846; H01L 2224/81385; H01L 2224/83385; H01L 2224/83439; H01L 2224/85439; H01L 2933/0033; H01L 2933/0066

See application file for complete search history.

(56) References Cited

U.S. PATENT DOCUMENTS

| | | |
|---|---|---|
| 2013/0037833 A1 | 2/2013 | Nam et al. |
| 2015/0034366 A1* | 2/2015 | Yoshioka ............... H05K 3/107 174/251 |
| 2015/0377721 A1* | 12/2015 | Sato ...................... G01L 1/2243 73/862.621 |
| 2016/0316558 A1* | 10/2016 | Sakai ...................... H01L 23/12 |

FOREIGN PATENT DOCUMENTS

| | | |
|---|---|---|
| KR | 20150130129 A | 11/2015 |
| KR | 101582494 B1 | 1/2016 |

* cited by examiner

| Conventional Cu metal layer | |
|---|---|
| Test | Chip separating force (gf) |
| 1 | 1266.8 |
| 2 | 1594.0 |
| 3 | 1608.6 |
| 4 | 1317.9 |
| 5 | 1228.8 |
| 6 | 1208.8 |
| 7 | 1206.7 |
| 8 | 1714.5 |
| 9 | 1715.4 |
| 10 | 1286.3 |
| 11 | 1162.2 |
| 12 | 1782.2 |
| 13 | 1478.8 |
| 14 | 1493.8 |
| 15 | 1539.6 |
| Avg. | 1440.3 |
| Stdev. | 212.6 |

<Before shearing test>

<After shearing test>

| Cu metal layer | |
|---|---|
| Test | Chip separating force (gf) |
| 1 | 1556.2 |
| 2 | 1526.5 |
| 3 | 1455.0 |
| 4 | 1566.5 |
| 5 | 1673.8 |
| 6 | 1738.9 |
| 7 | 1435.1 |
| 8 | 1941.5 |
| 9 | 1782.3 |
| 10 | 1669.0 |
| 11 | 1857.6 |
| 12 | 1490.0 |
| 13 | 1612.3 |
| 14 | 1628.4 |
| 15 | 1759.7 |
| Avg. | 1646.2 |
| Stdev. | 148.5 |

<Before shearing test>

<After shearing test>

METHOD FOR MANUFACTURING CHIP-MOUNTING SUBSTRATE, AND CHIP-MOUNTING SUBSTRATE

CROSS-REFERENCE TO RELATED PATENT APPLICATION

This U.S. non-provisional patent application claims priority under 35 U.S.C. § 119 of Korean Patent Application No. 10-2016-0060377 filed on May 17, 2016 in the Korean Patent Office, the entire contents of which are hereby incorporated by reference.

TECHNICAL FIELD

The present invention relates to a method for manufacturing a chip-mounting substrate and, more particularly, to a method for manufacturing a chip-mounting substrate, which includes an etching step of etching at least a portion of a precoat through a laser to form a pattern and a step of forming a metal layer in the pattern.

BACKGROUND

In general, a light demitting diode (LED) as a semiconductor light demitting diode is an environment-friendly light source not causing pollution. The light demitting diode draws attention in a variety of fields. In recent years, as the use range of LEDs is expanded to various fields such as an indoor/outdoor lighting, an automobile headlight and a backlight unit (BLU) of a display device, there is a need to achieve high luminous efficiency and excellent heat dissipation characteristics. In order to obtain a high efficiency LED, it is necessary to primarily improve the material or structure of the LED. In addition, it is also necessary to improve the structure of an LED package and the materials used for the LED package.

Hereinafter, various chips including LEDs for emitting light will be generally referred to as "optical element chips". A structure in which optical element chips are mounted on a metal substrate will be referred to as "chip package". As shown in FIG. 1, the conventional optical element package includes a chip-mounting metal substrate 100. The metal substrate 100 includes conductive portions 110, insulating portions 120 and a cavity 140. Bumps 130 are formed inside the cavity 140.

The bumps 130 are formed inside the cavity 140 at a predetermined height on the surfaces of the conductive portions 110 isolated from the insulating portions 120 and are boded to electrode portions of chips.

A conventional method for forming the bumps 130 is as follows. As shown in FIG. 2, copper is plated on the metal substrate 110 having the insulating portions 120, thereby forming a copper layer 3 on the metal substrate 110. Then, a photoresist coating 4 is formed on the copper layer 3 and is allowed to cure. Thereafter, a mask 5 having a pattern opposite to the shape of the bumps 130 is disposed on the photoresist coating 4. The photoresist coating 4 is etched through ultraviolet exposure and development. Thus, the photoresist coating 4 existing in the region in which bumps 130 are to be formed is removed. Then, the copper layer 3 not covered with the photoresist coating 4 is etched. As a result, bumps 130 are formed on the metal substrate 10. Then, the photoresist coating 4 remaining on the bumps 130 is removed.

However, this method has a problem in that high plating cost is required. Furthermore, a problem is posed in that chemical corrosion occurs due to the inclusion of a chemical etching work. Moreover, the process is complex.

In another conventional method differing from the aforementioned method, as shown in FIG. 3, a photoresist coating 4 is formed on a metal substrate 110 having an insulating portion 120 and is allowed to cure. After a mask 5 having a pattern formed in a bump shape is disposed on the photoresist coating 4, a pattern is formed on the photoresist coating 4 through ultraviolet exposure and development. Bumps 130 are formed in the pattern. The remaining photoresist coating 4 is removed.

However, in the method using the mask in this way, there is a problem in that a separate mask is required. Furthermore, the use of the flat mask poses a problem that the accuracy decreases when the bumps 130 are formed on a metal substrate having a cavity 140. In addition, it is difficult to manufacture a mask bent in a shape corresponding to the shape of the cavity 140 having a small size.

PRIOR ART DOCUMENTS

Patent Documents

Patent Document 1: Korean Patent Registration No. 10-1582494

SUMMARY

In view of the problems mentioned above, it is an object of the present invention to provide a method for manufacturing a chip-mounting substrate, which does not require a separate mask, uses a simple process and enhances accuracy.

According to one embodiment of the present invention, there is provided a method for manufacturing a chip-mounting substrate, including: a pre-coating step of forming a precoat on a substrate including a plurality of conductive portions and an insulating portion interposed between the conductive portions; an etching step of etching at least a portion of the precoat through a laser to form a pattern; and a step of forming a metal layer on the substrate, wherein the pattern is disposed on at least one of the conductive portions, and the metal layer is formed in the pattern.

In the etching step, an uneven portion may be formed on a region of an upper surface of the substrate corresponding to the pattern formed by the laser, and the metal layer may be formed on an upper surface of the uneven portion.

The method may further include: a silver coating step of forming a silver coating on the substrate before the pre-coating step. In the etching step, an uneven portion may be formed on a region of an upper surface of the silver coating corresponding to the pattern formed by the laser, and the metal layer may be formed on an upper surface of the uneven portion.

The method may further include: a cavity formation step of forming a cavity on an upper surface of the substrate before the pre-coating step. In the etching step, the pattern may be formed so as to be disposed in the cavity.

The metal layer may be formed by plating. The method may further include: a step of removing the precoat after the step of forming the metal layer.

According to another embodiment of the present invention, there is provided a chip-mounting substrate, including: a substrate including a plurality of conductive portions and an insulating portion interposed between the conductive portions; and a metal layer disposed on at least one of the conductive portions, wherein the metal layer is formed on an uneven portion formed on the substrate by irradiation of laser light.

An uneven portion having a shape corresponding to the shape of the uneven portion formed on the substrate may be formed on an upper surface of the metal layer.

At least a portion of the uneven portion may be formed to make a closed curve. A silver coating may be formed between upper surfaces of the conductive portions and the metal layer, and the uneven portion may be formed on the silver coating.

According to the present method for manufacturing a chip-mounting substrate mentioned above, the following effects may be achieved.

The method includes an etching step of etching at least a portion of a precoat through a laser to form a pattern and a step of forming a metal layer in the pattern. Therefore, a separate mask is not required, the process is simple, and the accuracy of the position and shape of the metal layer is improved.

Furthermore, the metal layer is formed only in the region in which the metal layer is to be formed. Therefore, the manufacturing cost is reduced. Chemical corrosion is not generated because there is no need to perform a chemical etching work.

Moreover, the portions other than the metal layer are protected from a chemical solution or an external process environment by the precoat and are kept smooth. Thus, the light emitted from the chips mounted on the metal substrate is reflected in an effective manner.

In the etching step, an uneven portion is formed by the laser on the upper surface of the metal substrate in the region corresponding to the pattern. This makes it possible to further increase the bonding force between the metal substrate and the metal layer without having to perform an additional process.

The method further includes a silver coating step of forming a silver coating on the upper surface of the metal substrate. The metal layer is formed on the upper surface of the silver coating. Due to the silver coating, the light emitted from the chips mounted on the metal substrate is reflected in an effective manner. Furthermore, the metal substrate can be protected by the silver coating.

Since the metal substrate is made of a metallic material, it is possible to easily form the metal layer the electroplating.

Inasmuch as an uneven portion is formed on the upper surface of the metal layer in a corresponding relationship with the uneven portion of the metal substrate, it is possible to improve the bonding force with the chips.

At least a part of the uneven portion is formed to make a closed curve. This makes it possible to further improve the bonding force between the metal substrate and the metal layer.

DETAILED DESCRIPTION

Embodiments of the present invention will now be described in detail with reference to the accompanying drawings.

As for the same configurations of the present invention as those of the prior art, reference is made to the prior art. Detailed description thereof will be omitted.

Figure 1:
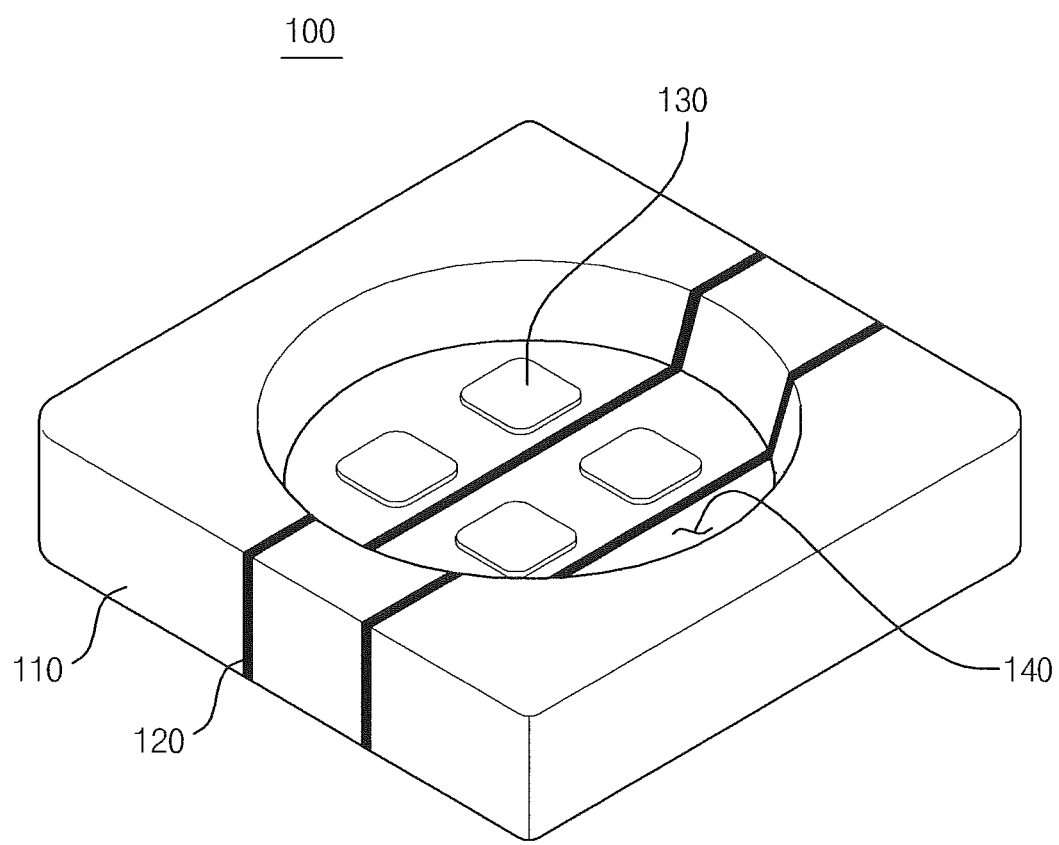
FIG. 1 is a perspective view showing a conventional chip-mounting substrate.
Figure 2:
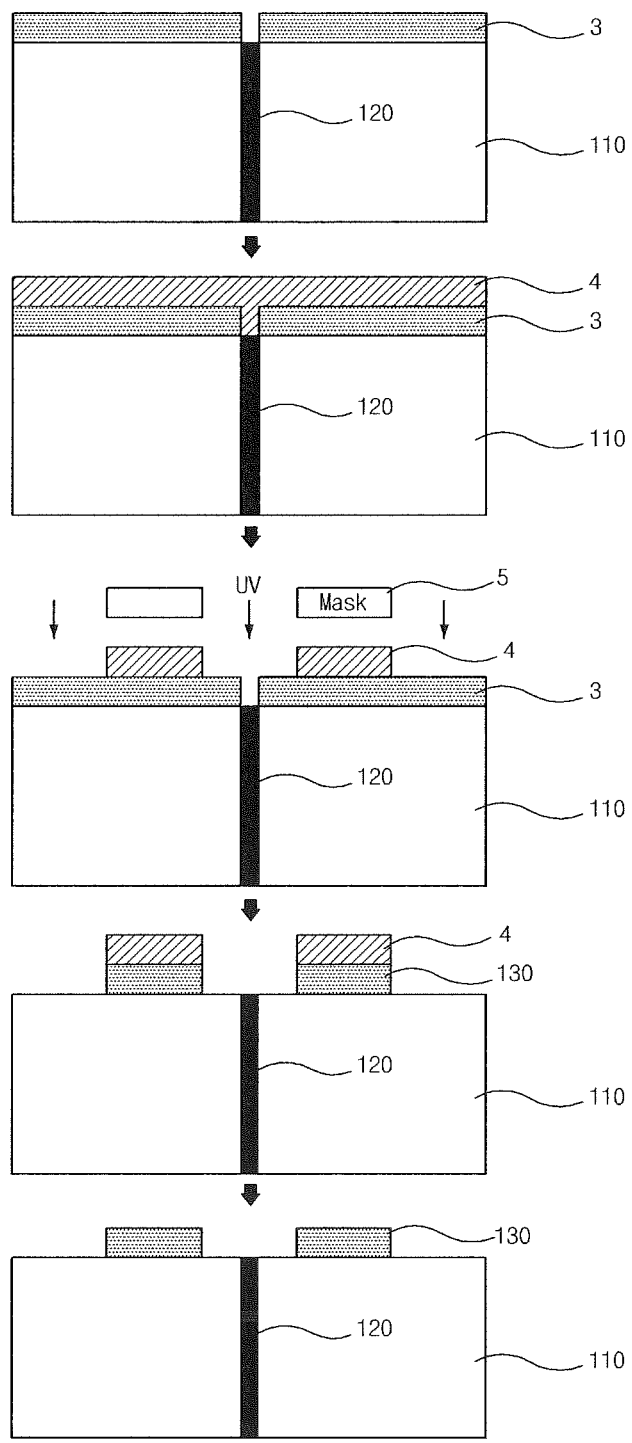
FIG. 2 is a process diagram showing a conventional method for manufacturing a chip-mounting substrate.
Figure 3:
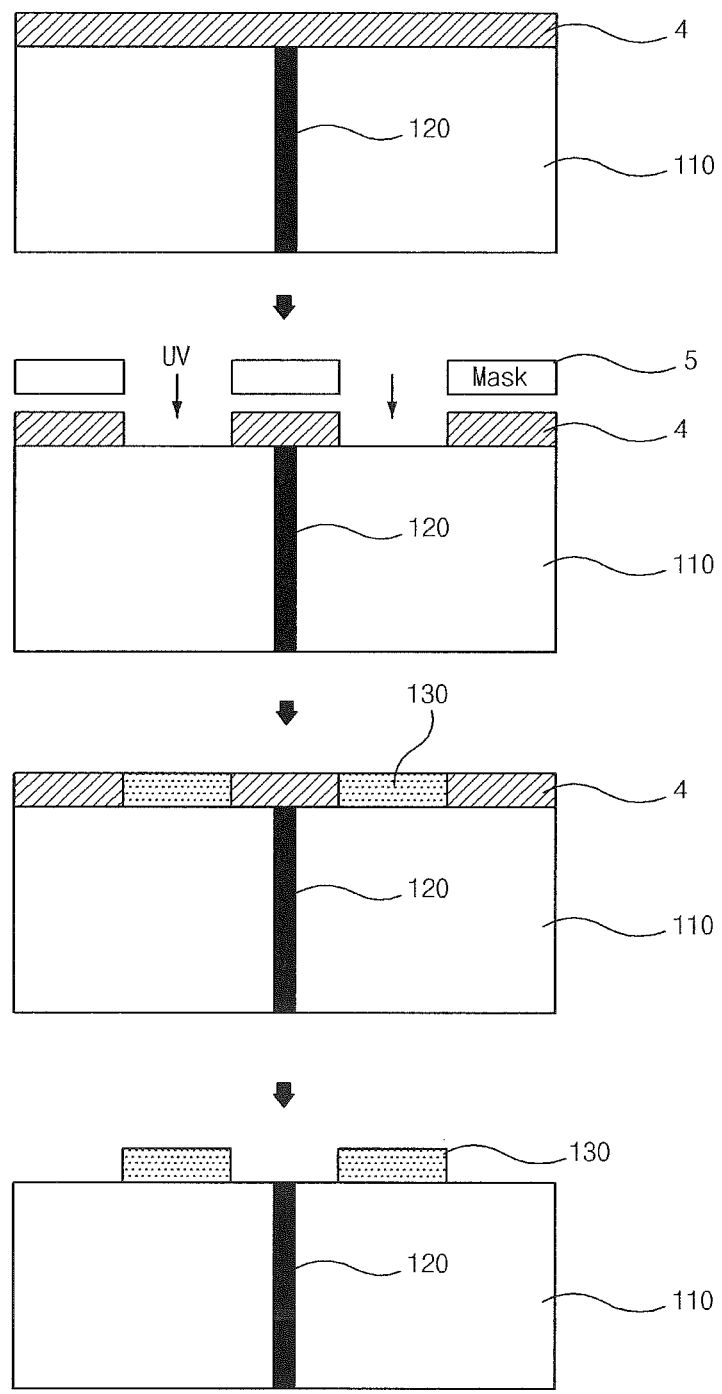
FIG. 3 is a process diagram showing another conventional method for manufacturing a chip-mounting substrate.
Figure 4:
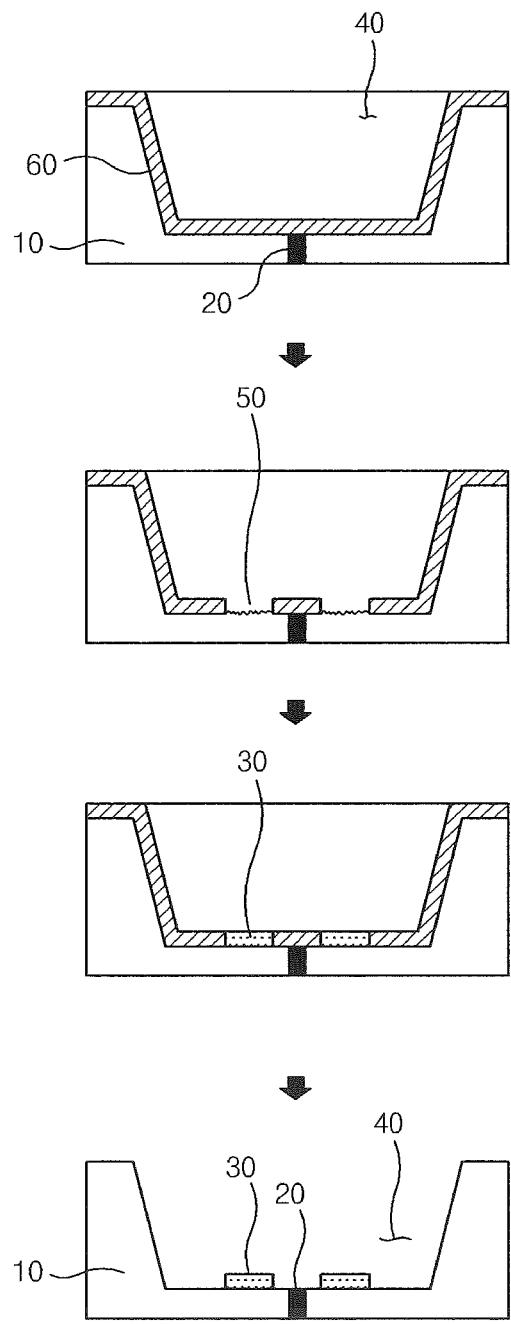
FIG. 4 is a process diagram showing a method for manufacturing a chip-mounting substrate according to an embodiment of the present invention.

Referring to FIG. 4, a method for manufacturing a chip-mounting substrate according to an embodiment of the present invention includes a pre-coating step of forming a precoat 60 on a metal substrate 10 divided into two conductive portions by an insulating portion 20, an etching step of etching at least a portion of the precoat 60 through a laser (not shown) to form a pattern 50, and a step of forming a metal layer 30 on the metal substrate 10, wherein the pattern 50 is disposed on at least one of the two conductive portions divided by the insulating portion 20, and the metal layer 30 is formed in the pattern 50.

The method of the present embodiment may further include a cavity formation step of forming a cavity 40 on an upper surface of the metal substrate 10.

The metal substrate 10 is made of a conductive metallic material so as to supply electric power to a chip mounted on the metal substrate 10. For example, the metal substrate 10 may be formed using an aluminum plate.

The cavity 40 is formed on the upper surface of the metal substrate 10 in a downwardly-recessed shape. In other words, the cavity 40 is formed so that the upper portion thereof is opened. A chip is mounted inside the cavity 40. The cavity 40 is defined by a slant sidewall and a planar bottom. The sidewall of the cavity 40 is obliquely formed so that the horizontal cross-sectional area of the cavity 40 becomes smaller downward. The bottom of the cavity 40 is formed in a circular shape. Alternatively, the bottom may be formed in such a shape that the bottom has a linear portion on one side thereof.

The insulating portion 20 for electrically isolating the two conductive portions of the metal substrate 10 to apply electric power to respective electrode portions of the chip is formed in the metal substrate 10. In other words, the metal substrate 10 is divided into at least two conductive portions by the insulating portion 20. In the present embodiment, the metal substrate 10 is divided into two conductive portions by the insulating portion 20. The insulating portion 20 is disposed in the central portion of the metal substrate 10. Alternatively, the insulating portion 20 may not be disposed in the central portion of the metal substrate 10 but may be disposed in a position biased toward one side of the metal substrate 10. The metal substrate 10 divided by the insulating portion 20 receives a positive voltage and a negative voltage from the outside. The insulating portion 20 is disposed across the cavity 40.

The insulating portion 20 may be formed of an insulating film made of a synthetic resin. The insulating portion 20 is bonded to the metal substrate 10 by an adhesive agent or the like. In order to increase the bonding force, the insulating portion 20 is bonded to the metal substrate 10 with bonding films interposed therebetween. At this time, in order to further increase the bonding force, a bonding process may be performed in a high-temperature high-pressure chamber capable of maintaining a pressure and a temperature higher than a room temperature and an atmospheric pressure. In addition, the bonding step may be performed by mechanically or chemically roughening the bonding surfaces. For example, when the metal substrate 10 is made of an aluminum material as in the present embodiment, the respective bonding surfaces may be anodized before the bonding process of the insulating portion 20 in order to increase the bonding force. The bonding surfaces thus anodized may be roughened.

The precoat 60 is formed on the metal substrate 10 having the cavity 40 and the insulating portion 20. In the present embodiment, the precoat 60 is formed on the upper surface of the metal substrate 10. Alternatively, a metal coating may be formed on the metal substrate 10 before the pre-coating step. In this case, the precoat 60 is formed on the metal coating disposed on the outermost surface of the metal substrate 10 before the pre-coating step.

The precoat 60 is formed on the entire upper surface of the metal substrate 10 and is formed inside and outside the cavity 40 and on the insulating portion 20. The precoat 60 may be a photoresist coating.

In the etching step, the light of a laser (not shown) is irradiated on the precoat 60 to etch at least a portion of the precoat 60, thereby forming a pattern 50 having a groove shape.

Figure 7:
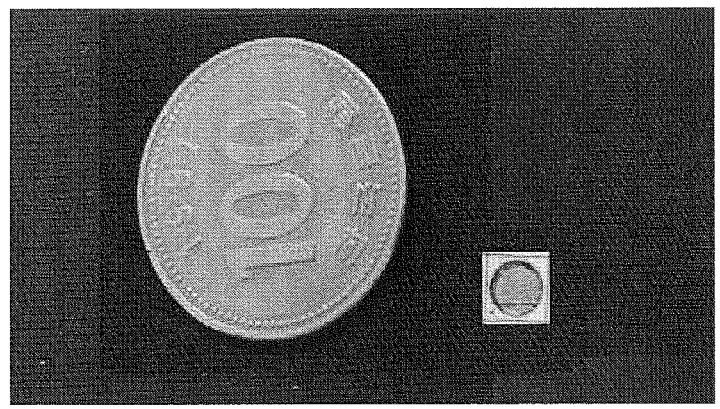
FIG. 7 is a photograph for comparing the size of a chip-mounting substrate according to an embodiment of the present invention with a coin.

As shown in FIG. 7, the chip-mounting substrate is formed in a size far smaller than a coin. The pattern 50 is formed on the chip-mounting substrate having such a small size through the use of the laser. It is possible to accurately form a fine pattern 50 on the chip-mounting substrate. The pattern 50 is disposed at least one of the two conductive portions of the metal substrate 10 divided by the insulating portion 20.

In the present embodiment, the pattern 50 is disposed in the two conductive portions of the metal substrate 10 divided by the insulating portion 20. That is to say, the pattern 50 is disposed on both sides of the insulating portion 20. Furthermore, the pattern 50 is formed on the bottom of the cavity 40 and is disposed inside the cavity 40. Alternatively, the pattern 50 and the metal layer 30 may be disposed on only one of the two conductive portions of the metal substrate 10 divided by the insulating portion 20.

In the etching step, an uneven portion is formed by the laser on the upper surface of the metal substrate 10 in a region corresponding to the pattern 50.

The etching step includes primary laser irradiation and a secondary laser irradiation. The pattern 50 is formed in the precoat 60 through the primary laser irradiation. Then, an uneven portion is formed by the secondary laser irradiation on the upper surface of the metal substrate 10 exposed by the primary laser irradiation. Preferably, the electric power (Watt) at the time of secondary laser irradiation is lower than the electric power at the time of primary laser irradiation. More specifically, the electric power at the time of secondary laser irradiation may be set to become ¼ or less of the electric power at the time of primary laser irradiation. In addition, the electric power at the time of primary laser irradiation may be set to 40% of the electric power of a laser irradiation device. The electric power at the time of secondary laser irradiation may be set to 10% of the electric power of the laser irradiation device.

By performing the laser irradiation at two levels in this way, it is possible to further enhance the accuracy of the pattern 50.

Figure 8:
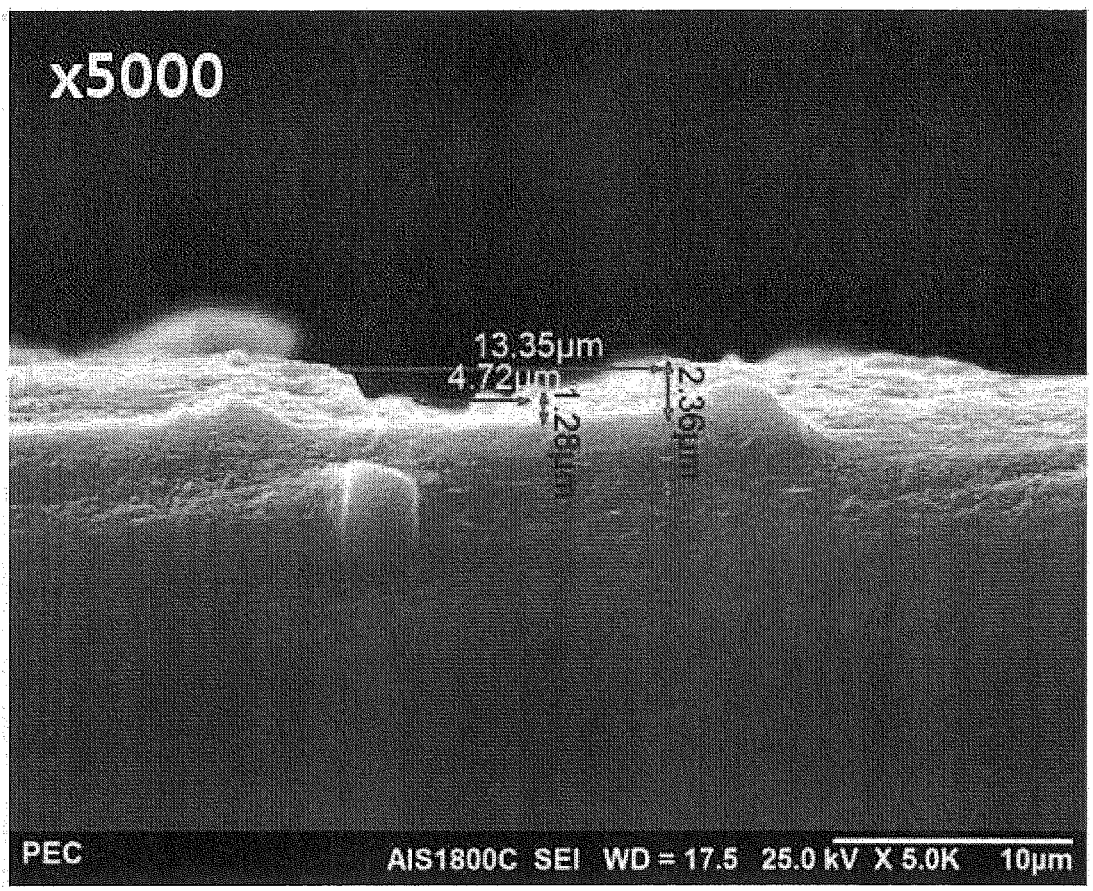
FIGS. 8 to 10 are electron microscope photographs showing grooves formed when laser light is irradiated on a chip-mounting substrate according to an embodiment of the present invention.

As shown in FIG. 8, the maximum depth of the groove of the uneven portion formed when the electric power of the laser irradiation device is 1.5 W is 2.36 μm and the maximum width of the groove is 13.35 μm.

Figure 9:
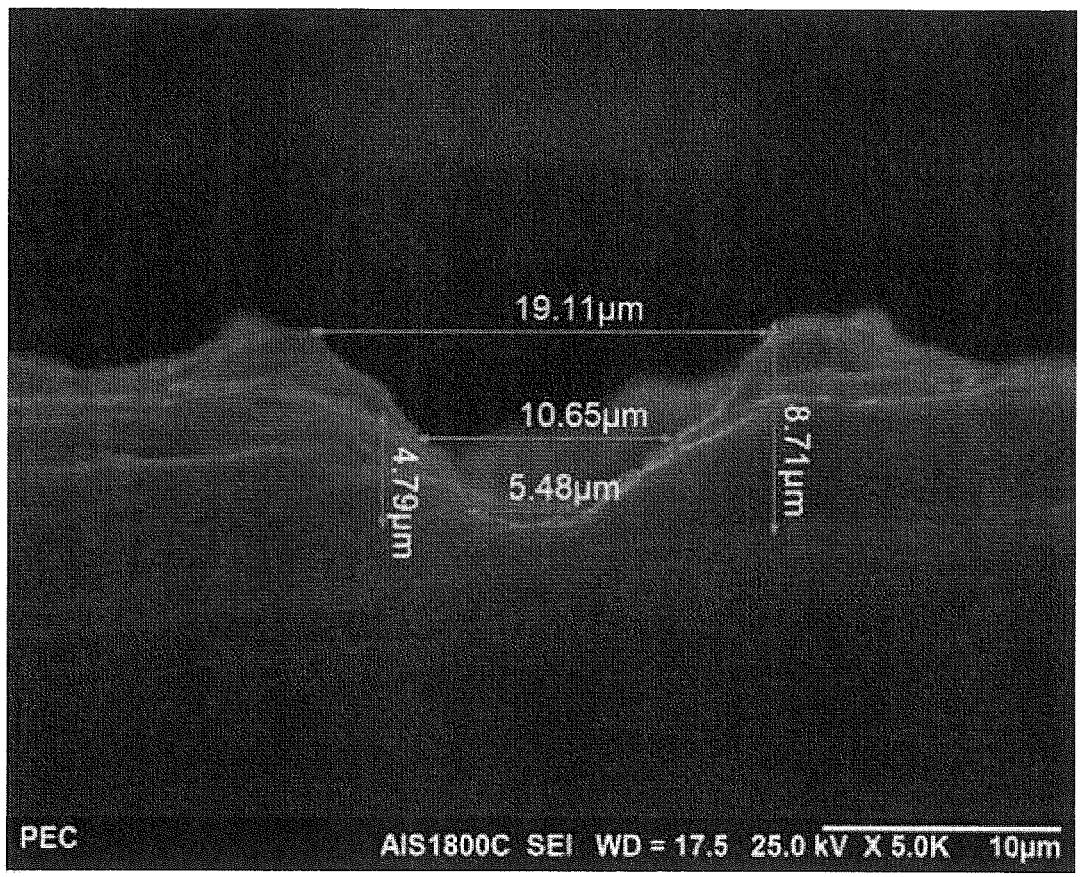

As shown in FIG. 9, the maximum depth of the groove of the uneven portion formed when the electric power of the laser irradiation device is 7.5 W is 8.71 μm and the maximum width of the groove is 19.11 μm.

Figure 10:
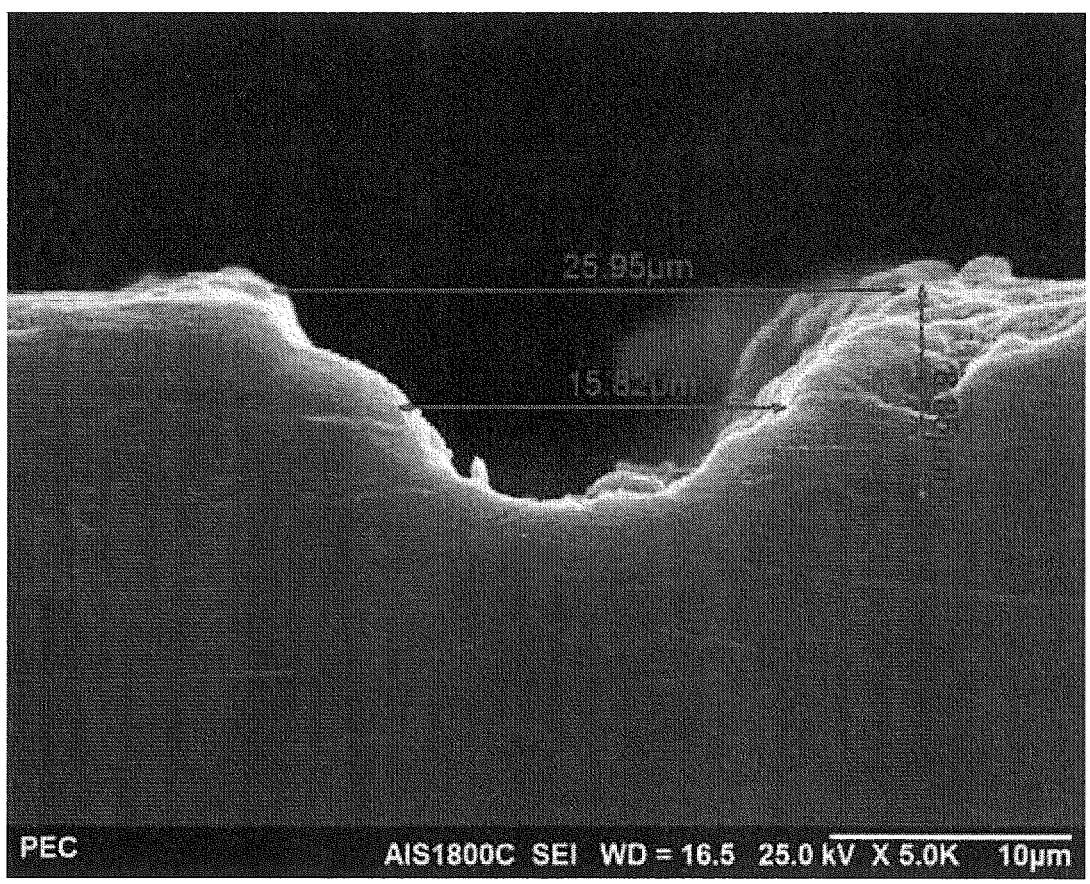

As shown in FIG. 10, the maximum depth of the groove of the uneven portion formed when the electric power of the laser irradiation device is 15 W is 8.85 μm and the maximum width of the groove is 25.95 μm.

Alternatively, simultaneously with the etching, an uneven portion may be formed on the surface (the upper surface) of the metal substrate 10 on which the precoat 60 is formed. In other words, the etching and the formation of the uneven portion may be simultaneously performed by irradiating laser light once.

The pattern 50 or the uneven portion is formed by irradiating laser light in the shape of the edge of the metal layer 30 (for example, in a rectangular shape) and then irradiating laser light in the same shape at a smaller size. In other words, the pattern 50 or the uneven portion is formed by irradiating laser light in the shape of a closed curve at a gradually reducing size.

Then, the metal layer 30 is formed in the pattern 50. In this way, the metal layer 30 is formed on the upper surface of the metal substrate 10 on which the precoat 60 is formed. Accordingly, the uneven portion is formed on the surface on which the metal layer 30 is formed. Thus, the metal layer 30 is effectively bonded to the metal substrate 10.

The metal layer 30 thus formed is made of a conductive material and serves as a bump. The metal layer 30 is formed on the surface of the metal substrate 10 so as to protrude upward at a predetermined height.

Figure 5:
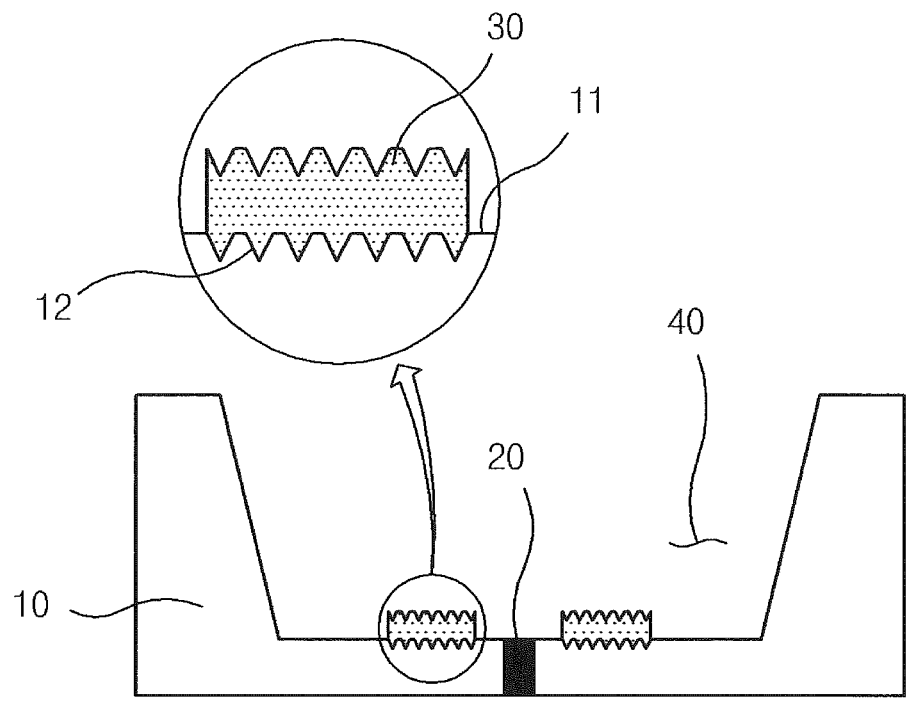
FIG. 5 is a sectional view of a chip-mounting substrate according to an embodiment of the present invention.
Figure 6:
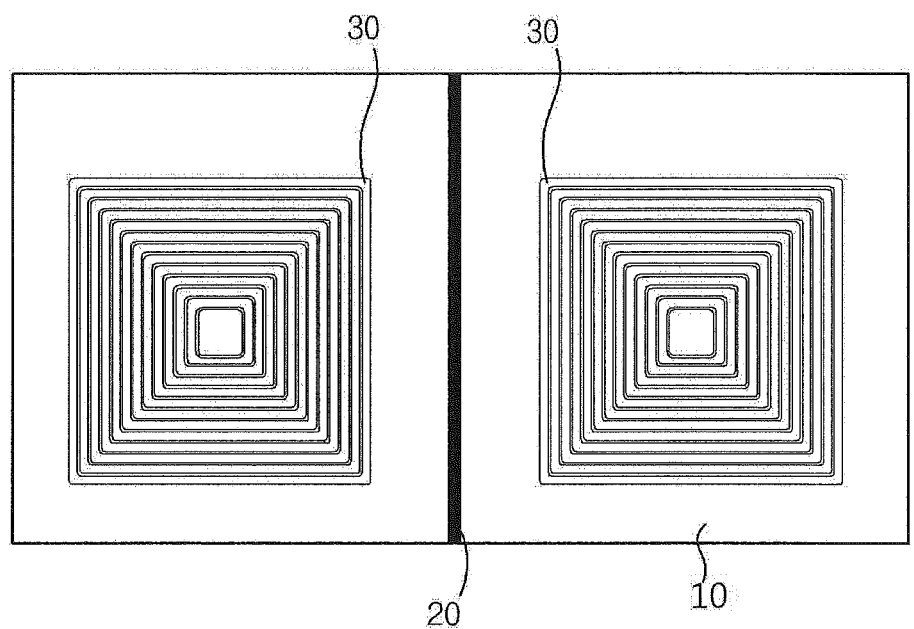
FIG. 6 is a partially enlarged plan view of a metal layer of a chip-mounting substrate according to an embodiment of the present invention.

As shown in FIGS. 5 and 6, an uneven portion may be formed on the upper surface of the metal layer 30 in a shape corresponding to the shape of the uneven portion formed on the metal substrate 10. Due to the existence of the uneven portion formed on the metal substrate 10, the uneven portion on the upper surface of the metal layer 30 is formed without having to perform a separate process.

The height of the metal layer 30 is set smaller than the depth of the cavity 40. The electrode portions of the chip mounted on the metal substrate 10 are bonded to the metal layer 30. The metal layer 30 formed on the metal substrate 10 made of a metallic material may be easily formed through a plating process. The precoat 60 is removed after forming the metal layer 30.

A solder resist layer (not shown) may be formed on the upper surface of the metal substrate 10. The solder resist layer is formed in a region other than the region in which the metal layer 30 is formed.

As shown in FIG. 5, the chip-mounting substrate of the present embodiment manufactured by the aforementioned method includes a metal substrate 10, an insulating portion 20 configured to divide the metal substrate 10 into two conductive portions, and a metal layer 30 disposed on at least one of the two conductive portions divided by the insulating portion 20, wherein the metal layer 30 is formed on an uneven portion 12 of the metal substrate 10 formed by irradiation of laser light.

A cavity 40 having an open upper portion is formed on the upper surface of the metal substrate 10 having a plate shape. The cavity 40 is defined by a bottom 11 and a sidewall surrounding the periphery of the bottom 11.

The bottom 11 is formed in a planar shape. The uneven portion 12 is formed in a portion of the bottom 11. The uneven portion 12 is formed so as to have ridges and valleys. Flat portions may be formed in the top ends of the ridges of the uneven portion 12.

At least a portion of the uneven portion 12 is formed so as to make a closed curve. In the present embodiment, the uneven portion 12 is formed to make a plurality of concentric closed curves differing in size from each other.

The metal layer 30 is formed on the uneven portion 12 so that the metal layer 30 can be strongly attached to the upper surface of the metal substrate 10.

A chip is bonded to the upper surface of the metal layer 30 through an adhesive agent. The metal layer 30 may be made of copper or gold. An uneven portion having ridges and valleys may be formed on the upper surface of the metal layer 30 in a corresponding relationship with the uneven portion 12 of the metal substrate 10. Thus, the bonding force between the metal layer 30 and the chip is further increased.

Figure 11:
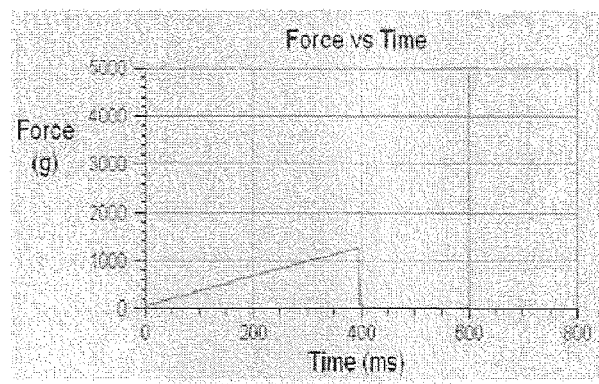
FIG. 11 is a table and a graph showing the result of a shearing test for checking a chip bonding force of a conventional chip-mounting substrate (when a metal layer is made of copper).
Figure 11:
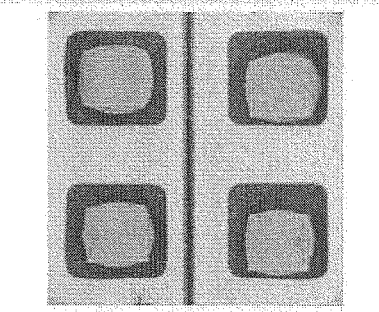
Figure 11:
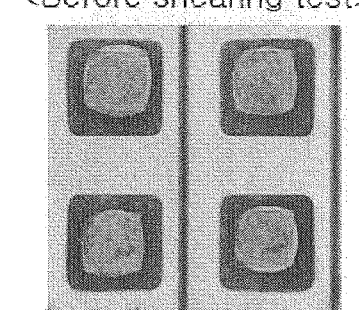
Figure 12:
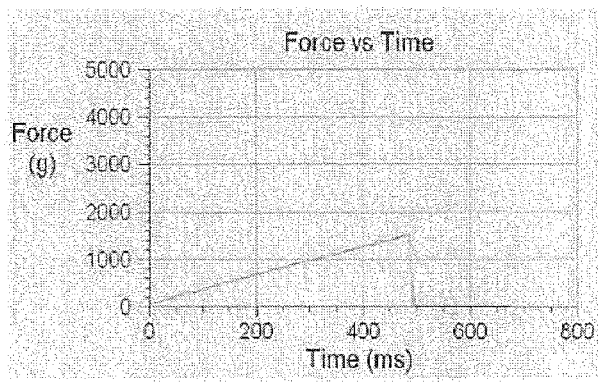
FIG. 12 is a table and a graph showing the result of a shearing test for checking a chip bonding force of a chip-mounting substrate according to an embodiment of the present invention (when a metal layer is made of copper).
Figure 12:
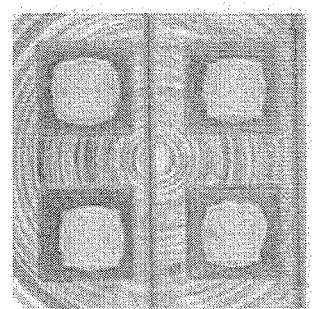
Figure 12:
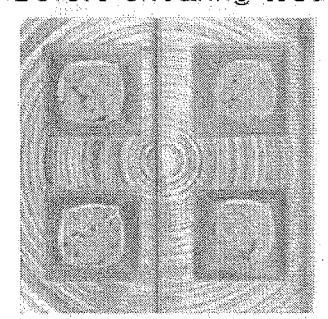

FIGS. 11 and 12 are tables and graphs showing the result of a shearing test for checking a chip bonding force of a conventional chip-mounting substrate a chip bonding force of the chip-mounting substrate according to the present embodiment.

In these tests, an adhesive agent T-3100 was used. The chip has a size of 24 mil×24 mil. The tests were conducted by pushing the chip from one side. These tests were conducted fifteen times.

The graphs of FIGS. 11 and 12 show the force (gf) depending on the time (ms) in one of the fifteen tests.

As can be noted from the test results, when the metal layer 30 is made of copper, the force required for separating the chip from the conventional chip-mounting substrate is 1440.3 gf on average. The force required for separating the chip from the chip-mounting substrate according to the present embodiment is 1646.2 gf on average. As a result, the force required for separating the chip from the chip-mounting substrate according to the present embodiment is larger than the force required for separating the chip from the conventional chip-mounting substrate.

From these test results, it can be noted that the bonding force between the chip and the chip-mounting substrate according to the present embodiment is further increased as compared with the prior art.

In the case where a metal coating is formed between the upper surface of the metal substrate 10 and the metal layer 30, an uneven portion is formed in the metal coating. The metal layer 30 is formed on the metal coating having the uneven portion.

In the present embodiment, the metal layer 30 is divided into two parts by the insulating portion 20. The metal layer 30 is formed to protrude upward at a predetermined height so that the upper surface of the metal layer 30 is spaced apart from the bottom 11 of the cavity 40 of the metal substrate 10.

Preferably, the region of the bottom 11 other than the uneven portion 12 is formed in a smooth state. This makes it possible to effectively reflect the light of the chip mounted on the metal substrate 10.

Figure 13:
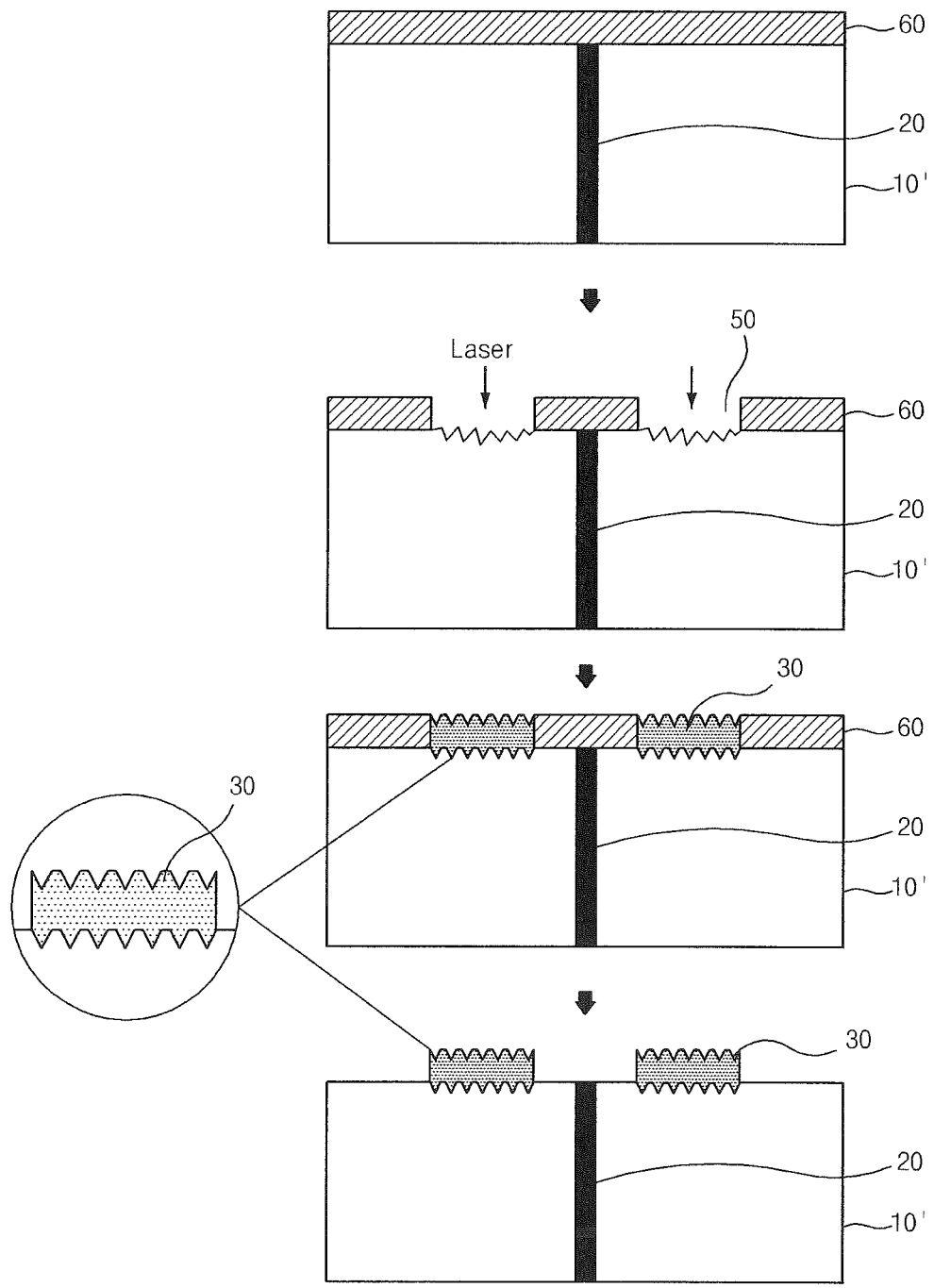
FIG. 13 is a process diagram showing a method for manufacturing a chip-mounting substrate according to another embodiment of the present invention.

Alternatively, as shown in FIG. 13, a chip-mounting substrate may be manufactured by forming a precoat 60 on an upper surface of a metal substrate 10' having an insulating portion 20 and a flat upper surface on which a cavity is not formed, forming pattern 50 in the precoat 60 through a laser, forming a metal layer 30 in the pattern 50, and then removing the precoat 60.

Figure 14:
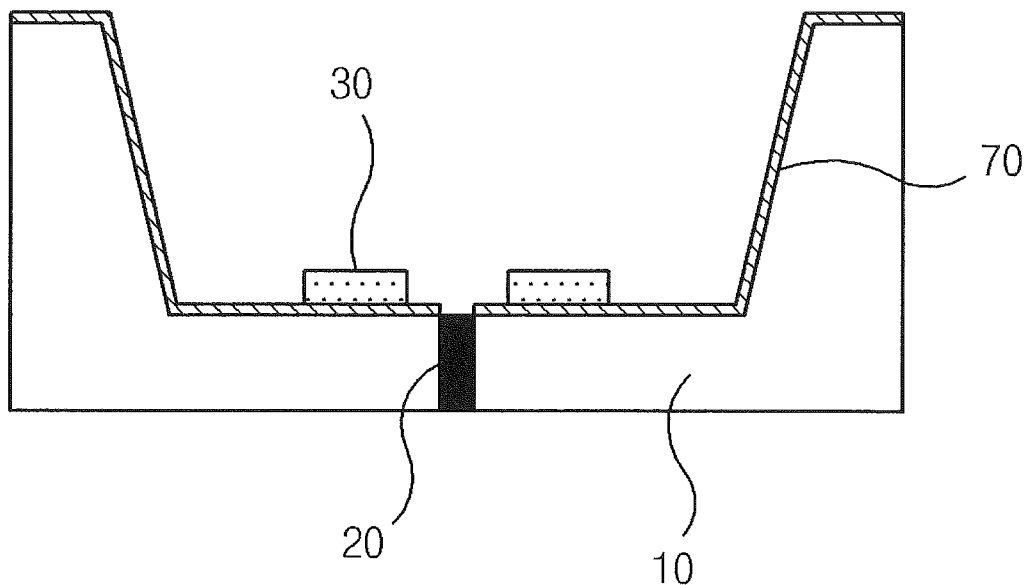
FIG. 14 is a sectional views of a chip-mounting substrate according to a further embodiment of the present invention.
Figure 15:
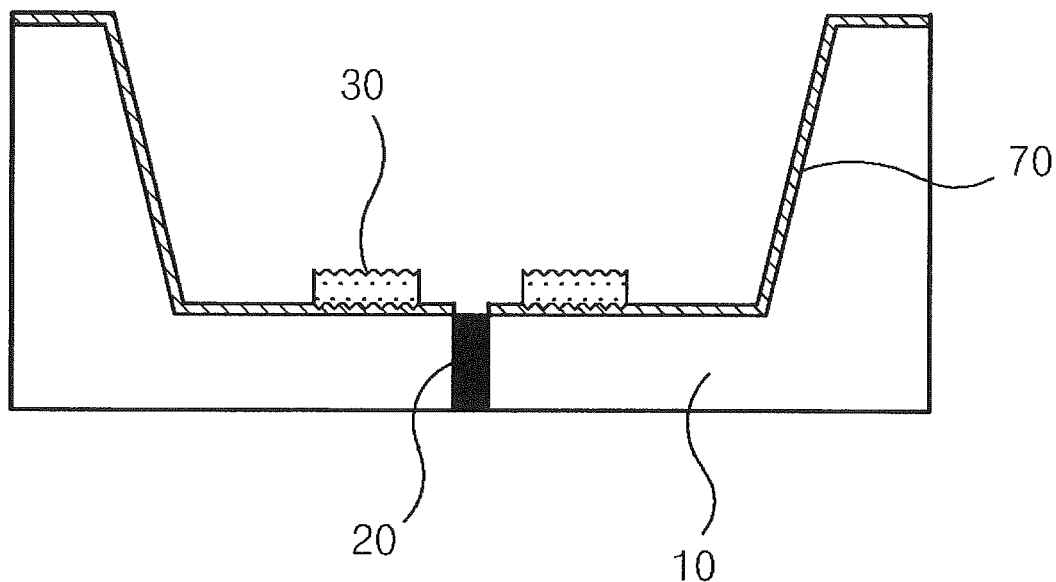
FIG. 15 is a sectional views of a chip-mounting substrate according to a modification of the further embodiment of the present invention.

Referring to FIGS. 14 and 15, a method for manufacturing a chip-mounting substrate according to another embodiment of the present invention includes a pre-coating step of forming a precoat on a metal substrate 10 divided into two conductive portions by an insulating portion 20, an etching step of etching at least a portion of the precoat through a laser (not shown) to form a pattern, and a step of forming a metal layer 30 on the metal substrate 10, wherein the pattern is disposed at least one of the two conductive portions divided by the insulating portion 20, the metal layer 30 is formed in the pattern, a silver coating step of forming a silver coating 70 on an upper surface of the metal substrate 10 is performed before the pre-coating step. According to FIG. 15, an uneven portion may be formed by a laser in the etching step on a region of an upper surface of the silver coating 70 corresponding to the pattern.

The silver coating 70 is formed on the entire upper surface of the metal substrate 10 and is formed inside and outside a cavity. The silver coating 70 is formed by electroplating. Thus, the silver coating 70 is not formed on the insulating portion 20.

The precoat is formed on the metal substrate 10 on which the silver coating 70 is formed. In other words, the precoat is formed on the upper surface of the silver coating 70 and the upper surface of the insulating portion 20.

After forming the precoat, the precoat is etched with a laser as in the embodiment described above. During the etching, an uneven portion may be formed on the upper surface of the silver coating 70 on which the precoat is formed.

The metal layer 30 may be formed in the pattern by a plating process. That is to say, the metal layer 30 may be formed on the upper surface of the silver coating 70 having the uneven portion.

In this way, the metal layer 30 is formed on the silver coating 70. Thus, the light emitted from the chip mounted on the metal substrate 10 is reflected in an effective manner. In addition, the metal substrate 10 may be protected by the silver coating 70. In the chip-mounting substrate formed by this method, the silver coating 70 is disposed between the upper surface of the metal substrate 10 and the metal layer 30. The metal layer 30 may be formed in the uneven portion formed on at least a portion of the upper surface of the silver coating 70.

While some embodiments of the present invention have been described above, a person skilled in the relevant technical field will be able to diversely change or modify the present invention without departing from the spirit and scope of the present invention defined in the claims.

What is claimed is:

1. A method for manufacturing a chip package comprises:

forming an uneven portion on an upper surface of a metal substrate on which an insulating portion for electrically separating the metal substrate, as to apply electricity to each of the electrode portions of a chip;

forming a metal layer on the uneven portion; and mounting the chip on the metal layer, wherein forming the uneven portion comprises forming the uneven portion on the upper surface of the metal substrate by irradiating a laser on the upper surface of the metal substrate, so as to be formed only on a part of the upper surface of the metal substrate, wherein forming the metal layer comprises: forming the metal layer only on the uneven portion, so as to protrude upwards at a predetermined height from the upper surface of the metal substrate, wherein the metal layer is not formed on the upper surface of the metal substrate except for the uneven portion, wherein mounting the chip comprises: mounting the chip to receive the electricity from the metal substrate so that the electricity supplied to the metal substrate is transferred to the chip through the metal substrate, the uneven portion, and the metal layer.

* * * * *